United States Patent
Lehner et al.

Patent Number: 6,037,043
Date of Patent: Mar. 14, 2000

[54] UV-HARDENABLE AND THERMALLY HARDENABLE EPOXY RESINS FOR UNDERFILLING ELECTRICAL AND ELECTRONIC COMPONENTS

[75] Inventors: Barbara Lehner, Munich; Recai Sezi, Roettenbach, both of Germany

[73] Assignee: Siemens Aktiengesellscaft, Munich, Germany

[21] Appl. No.: 08/934,448

[22] Filed: Sep. 19, 1997

[30] Foreign Application Priority Data

Sep. 20, 1996 [DE] Germany ............ 196 38 630

[51] Int. Cl.⁷ .................. B05D 5/12; B35B 3/00; H05K 1/03; C08F 2/46
[52] U.S. Cl. ............ 428/209; 428/206; 427/386; 427/558; 427/559; 427/385.5; 427/96; 156/48; 174/260; 174/256; 522/83; 522/148; 522/170
[58] Field of Search .............. 522/148, 170, 522/83; 174/258, 260, 256; 156/48; 427/386, 558, 559, 96, 385.5; 428/33, 206, 209

[56] References Cited

U.S. PATENT DOCUMENTS

| | | | |
|---|---|---|---|
| 4,141,055 | 2/1979 | Berry et al. | 361/410 |
| 4,518,631 | 5/1985 | Antonen | 427/96 |
| 4,590,224 | 5/1986 | Frisch et al. | 521/155 |
| 4,842,800 | 6/1989 | Walles et al. | 264/272.13 |
| 5,095,053 | 3/1992 | Walles et al. | 523/466 |
| 5,216,278 | 6/1993 | Lin et al. | 257/688 |
| 5,242,715 | 9/1993 | Schoen et al. | 427/386 |
| 5,248,710 | 9/1993 | Shiobara et al. | 523/435 |
| 5,326,589 | 7/1994 | Okinoshima et al. | 427/79 |
| 5,353,498 | 10/1994 | Fillion et al. | 29/840 |
| 5,497,033 | 3/1996 | Fillion et al. | 257/723 |
| 5,677,045 | 10/1997 | Nagai et al. | 428/260 |

FOREIGN PATENT DOCUMENTS

| | | |
|---|---|---|
| 0 399 199 B1 | 4/1990 | European Pat. Off. |
| 195 23 897 A1 | 6/1995 | Germany. |

*Primary Examiner*—James J. Seidleck
*Assistant Examiner*—Sanza L. McClendon
*Attorney, Agent, or Firm*—Hill & Simpson

[57] ABSTRACT

UV-hardenable and thermally hardenable epoxy resins for the underfilling process in electrical and electronic components are provided. A new casting resin component has an increased storage stability at room temperature of at least 6 months and improved characteristics for the underfilling process including faster hardening and lower viscosity. Filler material with a maximum grain size of 20 μm and a siloxane component are provided in addition to the casting resin formulation.

7 Claims, 1 Drawing Sheet

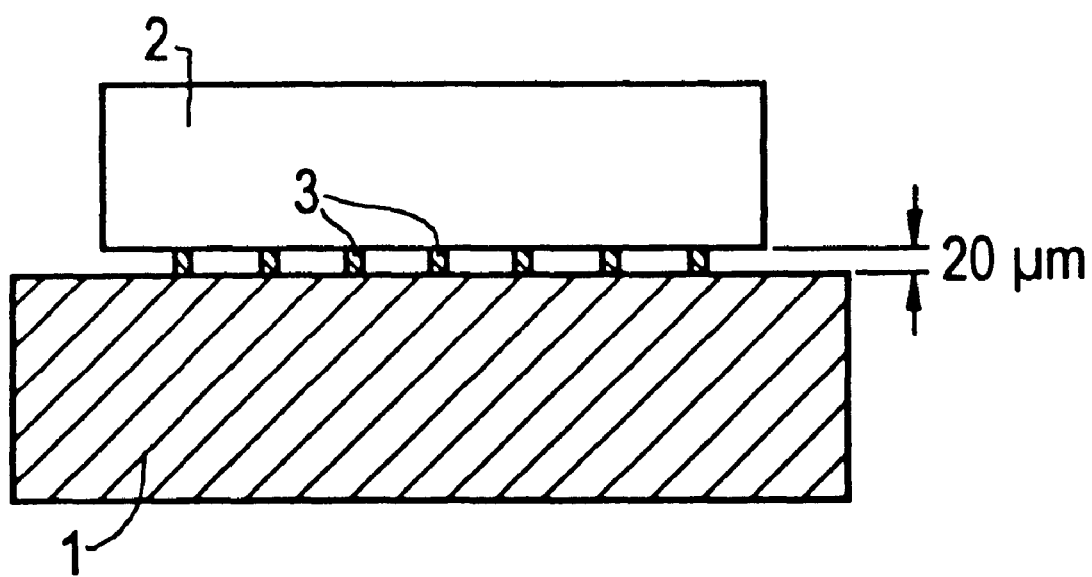

UV-HARDENABLE AND THERMALLY HARDENABLE EPOXY RESINS FOR UNDERFILLING ELECTRICAL AND ELECTRONIC COMPONENTS

BACKGROUND OF THE INVENTION

The invention relates to a sealing material for the underfilling of electronic and electrical components, which are sealed in an underfilling process for protection from environmental influences and to improve the resistance to fatigue of the solder connections of the components.

Sealing materials are known that consist of two-component epoxy resins, and that either must be mixed before processing or must be stored as a pre-mixture at $-40°$ C. At room temperature, they are available only for a few hours before they harden and become unusable. Disadvantages of this prior art include, on the one hand, the additional procedural step of the mixing of the two components before processing, and on the other hand the storage at low temperatures such as $-40°$ C. (see "Encapsulants used in Flip-Chip Packages," D. Suryanarayana, T. Y. Wu, J. A. Varcoe, IBM Microelectronics, IEEE Transact., Hybr., Manuf. Techn., Vol. 16, No. 8.858; 1993, and "Underfilling for Flip-Chip Mounting," M. Norris, Camelot Systems S. A. Conference proceedings "Adhesives in Electronics," Berlin 1994).

There is thus a need for sealing materials of this type that do not have to be mixed before processing and do not require storage at low temperatures.

SUMMARY OF THE INVENTION

It is an advantage of the present invention to provide a sealing material that can be stored at room temperature for a longer period of time and that is suitable for use as a sealing material for the underfilling technique for the protection of components from environmental influences and for the improvement of the resistance to fatigue of the contained soldered connections.

The present invention provides a mixture of an epoxy resin, a siloxane, and a filler material (whereby the filler material may not exceed a certain grain size) forms a three-phase system that is stable in the liquid state, in which the filler material is homogeneously distributed and epoxy/siloxane form a stable emulsion.

In an embodiment, the present invention is a casting resin formulation comprising the following components: an epoxy resin; a siloxane; a filler material with a maximum grain size less than 20 $\mu$m; a photo initiator; and a thermal initiator.

In addition, the present invention is directed towards the use of such a casting resin formulation in the underfilling of electronic components.

Other objects and advantages of the present invention will become apparent upon reading the following detailed description and appended claims, and upon reference to the accompanying drawing.

BRIEF DESCRIPTION OF THE DRAWING

FIG. 1 is a sectional view of a substrate and chip with a gap disposed therebetween in which the sealing compound of the present invention is inserted under capillary action.

It should be understood that the drawing is not necessarily to scale and that the embodiment is illustrated diagrammatically and in a fragmentary view. Details which are not necessary for an understanding of the invention or which render other details difficult to perceive may have been omitted. It should be understood, of course, that the invention is not necessarily limited to the particular embodiment illustrated herein.

DETAILED DESCRIPTION OF THE PRESENTLY PREFERRED EMBODIMENTS

In the inventive epoxy resin formulation, a composition of the components in the following ranges (indicated in weight percent) has proven advantageous, whereby the narrower ranges are always ranges that are preferred in relation to the broader ones:

epoxy component: between 15 and 75 percent or preferably between 18 and 65 percent or more preferably between 30 and 50 percent;

filler material: between 25 and 85 percent or preferably between 30 and 80 percent or more preferably between 50 and 70 percent;

siloxane component: between 0.2 and 15 percent or preferably between 1 and 10 percent or more preferably between 2 and 8 percent;

photoinitiator: between 0.01 and 5 percent or preferably between 0.05 and 2 percent or more preferably between 0.1 and 1 percent; and thermal initiator: between 0.01 and 5 percent or preferably between 0.05 and 2 percent or more preferably between 0.1 and 1 percent.

In addition, it has proven advantageous if, as the epoxy resin component, cycloaliphatic epoxy resin is used, preferably particularly pure, i.e., with a low ion content.

In addition, it has proven advantageous to use quartz material as filler material; quartz powder and/or $Al_2O_3$ is thereby particularly advantageous.

In addition, it is advantageous to use as the siloxane component an Isocyanuratesiloxane component, as specified in EP-PS 0 399 199 (whose content is hereby incorporated by reference).

In particular, this concerns the lsocyanuratesiloxane-containing organosilic compounds of the general formula

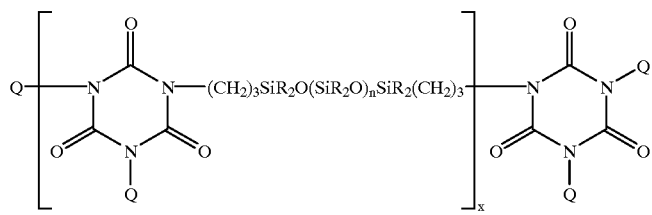

wherein Q=—(CH$_2$)$_3$ SiR$_2$O(SiR$_2$O)$_n$SiR$_2$R', n is a whole number from 0 to 25 and x is a whole number from 0 to 10, and for the radicals R and R', which may respectively be equal or different:

R is selected from the group consisting of alkyl, cycloalkyl, aryl, aralkyl or alkaryl, and R' is selected from the group consisting of an epoxy-functional radical with 4 to 10 C-atoms or a (meth) acrylate-functional radical with at least 6 C-atoms.

The alkyl, cycloalkyl, aryl, aralkyl or alkaryl groups of R and R$^1$ may be unsubstituted or substituted. The following groups are cited as examples for the radical R.

alkyls with 1 to 4 C atoms, such as methyl, ethyl, propyl, isopropyl, butyl and isobutyl, whereby the methyl radical is preferred;

cycloalkyls with 5 to 8 C atoms, such as cyclohexyl, methylcyclohexyl and cycloheptyl;

aryls with 6 to 10 C atoms, such as phenyl and napthtyl;

aralkyls, such as β-phenylethyl, β-phenylpropyl, o-methylphenylethyl, 3,5-deibromophenylethyl, p-nonylphenylethyl, o-bromophenylethyl, 3,5, deibromophenylethyl, p-chlorphenylethyl and 3,5-deichlorphenylethyl; alkaryls, such as tolyl.

The epoxy-functional radicals R' comprise 4 to 10 C atoms whereby the epoxy group is connected to the siloxane chain via a carbon bridge, which can also contain heteroatoms. These radicals R' can be derived from vinyl-functional epoxies or allyl-functional epoxies in such a way that the vinyl function or, respectively, allyl-function is added to an Si-H-function. As examples, the following compounds are named as vinyl-functional or, respectively, allyl-functional epoxies: allylglycidylether, 4-vinylcyclohexenoxide, 4-vinylnorbornenoxide and 1,2-epoxy-3-butene.

The (Meth)-acrylate-functional radicals R', in which the (Meth) acrylate group is likewise bound to the siloxane chain via a carbon bridge, can be derived from the epoxy-functional radicals, in such a way that the epoxy ring is opened by means of (meth) acrylate acid. In this case, the (Meth) acrylate-functional radicals comprise 7 to 14 C atoms. However, the (Meth) acrylate groups of the (meth) acrylate-functional radicals R' can also be bound to a carbon bridge to the siloxane chain in the manner of an ester or via a carbonate grouping or urethane grouping.

Organosilicon compounds of the following type are thereby preferred:

compounds in which the radicals R' are epoxy-functional radicals that can be derived from the following unsaturated epoxies: 1,2-epoxy-3-butene, 1,2-epoxy-5-hexene, 1,2-epoxy-7-octene, allylglycidylether, r-vinylcyclohexenoxide, 4-vinylnorornenoxide, norbornadienoxide, limonene oxide and dicyclopentadieneoxide;

compounds in which the radicals R' are (meth) acrylate-functional radicals, produced by ring opening of the epoxy radical of compounds of the type named above with (meth) acrylate acid;

compounds, in which the radicals R' are (meth) acrylate-functional radicals, which are bound to a carbon bridge to the siloxane chain in the manner of an ester or via a carbonate grouping or urethane grouping.

The compounds are polymerizeable organosilicon compounds containing isocyanurate, and comprising epoxy functions and/or (meth) acrylate functions. By means of the invention, liquid pre-polymers are thus created, in whose chemical construction rigid structure elements and flexible structure elements are combined, and which comprise reactive groups, via which a polymerization (of the pre-polymers) can result.

A further development of the invention is that a filler material with a maximum grain size smaller than 15 μm or preferably smaller than 10 μm is used as the filler component.

The term underfilling process refers to a method for sealing a gap between chip and substrate in which the sealing material is dosed along the edge of the chip in front of the gap and flows under this gap by means of capillary forces. In general, the chips have an edge length of 5 to 20 mm, and the gap has a height of 10 to 80 μm. It is thereby necessary that the gap between the substrate and the chip be filled with the resin in a suitable time. In a short time, the resin should harden sufficiently that a problem-free handling of the component is ensured. The hardened resin should be provided with suitable physical properties, such as low stress and low expansion coefficients and high chemical purity and good resistance to chemicals.

The inventive reaction epoxy mixtures are one-component systems that can be stored for several month at room temperature. During the storage time, use characteristics such as viscosity, flow behavior or hardening profile do not change, nor do the final properties of the hardened resin such as for example bonding and thermal mechanical properties.

The inventive casting resin formulation can be hardened either by means of UV radiation or thermally. Thus, for example an underfilled chip can be hardened at the edges, where the reaction resin can be reached by the UV radiation, by means of a short UV flash to such an extent that the component can be handled without difficulty. The shadowed region under the chip can be hardened by a thermal process that can ensue at a later time.

For the epoxy resin component of the casting resin formulation, epoxy resins and arbitrary mixtures of different epoxy resins are used. Here, the term "epoxy resin" correspondingly includes both homogenous epoxy resins and also mixtures of different epoxy resin. Epoxy resins that are cationically hardenable and that are free of solvent are thereby preferably used. The use of cycloaliphatic epoxies is thereby advantageous. These are available with a high degree of purity, i. e., with a low ion content, and thus with a low content of materials that promote corrosion. Commercially available cycloaliphatic epoxies also include mixtures of several cycloaliphatic epoxies. Suitable compounds are given for example by the following structural formulas.

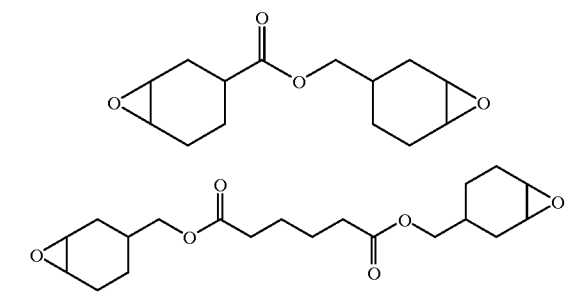

However, it is also possible to use mixtures of different epoxy resins, or, respectively, components containing epoxy groups. Aside from the already-named epoxy resins, glycidylethers, commonly used in the art, are suitable for use as epoxy resins in the present invention.

The term "siloxane" refers according to the invention to pure siloxanes and/or also to mixtures of different siloxanes.

As the siloxane component, polydimethylsiloxanes can be used, which during hardening tend to phase separation from the epoxy matrix, thereby forming micro-domains at whose boundary surfaces tensions can be reduced. According to the present invention, isocyanuratesiloxane, as specified for example as the siloxane component in EP-PS-0 399 199, is thereby preferably used. Mixtures of different siloxanes can also be used.

As the filler component, all filler materials standard in the formulation of epoxy resins with bonding agents, coated or uncoated, can be used, provided that they have the maximum grain size of less than or equal to 20 µm required for the invention. According to the invention, filler materials with maximum grain sizes of less than or equal to 15 µm are preferably used, advantageously less than or equal to 10 µm, and, particularly preferably, those whose maximum grain size does not exceed 7 µm. The type and external shape of the contained quartz material filler particles are arbitrary, as long as the maximal size of the grains lies within the indicated boundaries. Spherical particles are to be preferred. Reaction resins filled in this way yield the inventive good flow properties in the underflowing of the chip by means of capillary action.

In order to induce cationic hardening, a cationic photo initiator or a cationic photo initiator system is incorporated into the composition of the present invention.

Upon UV radiation, these photo initiators release reactive cations, e.g., protons, which initiate the cationic hardening process of the epoxy resin. The photo initiators are thereby largely derived from organic onium salts, in particular those with nitrogen, phosphorous, oxygen, sulfur, selenium, or iodine as the central atom of the cation. Aromatic sulfonium salts and iodonium salts with complex anions have thereby proven particularly advantageous. The sulfonium salts can thereby be present alternatively to or together with the iodonium salts. A photo initiator that releases a Lewis acid and is, for example realized as a π-donor transition metal complex is also possible. Phenacylsulfonium salts, hydroxyphenylsulfonium salts, and sulfoxonium salts are also possibilities. In addition, onium salts that are stimulated to produce acid not directly, but rather by means of a sensitizer can also be used. Organic silicon compounds, which release a silanol upon UV radiation in the presence of aluminum organic compounds, can also be used as photo initiators for the cationic hardening process.

The following sulfonium salt is, for example, well suited as a photo initiator. It is marketed by the Union Carbide Corporation under the trade name Cyracure UVI 6974.

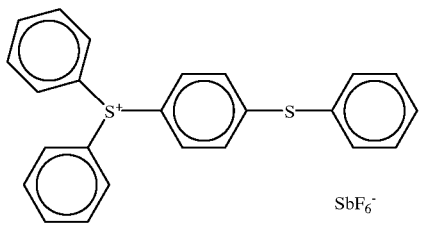

The thermal initiator component preferably contains a thiolanium salt according to the invention, which acts as a thermally activatable initiator. Benzylthiolanium salts with the following general structure are preferred:

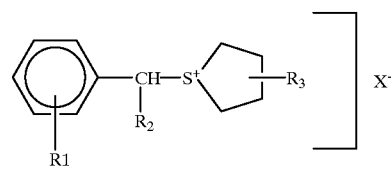

whereby R1 is selected from the group consisting of hydrogen, alkyl, aryl, alkoxy, thioether, halogen, CN or $NO_2$. R2 equals hydrogen, alkyl and aryl; R3 is selected from the group consisting of hydrogen, alkyl, aryl and an aromatic system condensed on the thiolane ring; $X^-$ is selected from the group consisting of $PF_6^-$, $AsF_6^-$ and $SbF_6^-$.

Unsubstituted benzylthiolanium salts are thereby preferably used, in particular benzyithiolanium hexafluoroantimonate.

In addition to the named components, other standard auxiliary materials, such as auxiliary wetting agent, auxiliary flowing agent, bonding agent, thixotropic agent, antifoaming agent, coloring, etc. may be contained in the inventive casting resin formulation. In the following, the invention is described in more detail on the basis of a possible exemplary embodiment, which is not intended to limit the scope of the claimed subject matter of the invention. All indications are in weight %.

Casting resin formulation, comprising:
29.1 cycloaliphatic diepoxide (CY 179, from the Ciba-Geigy)
3.30 Isocyanurate siloxane (Baysilone SSA 762, Bayer AG)
0.17 Glycidyloxypropylthrimethoxy siloxane (Silan A-187, UCC)
0.03 Acrylic resin (Modaflow, Monsanto)
0.17 Triarylsulfoniumhexafluoroantimonate (Cyracure UVI 6974)
0.23 Benzylthiolaniumhexafluorontimonate (PI 55, Aldrich) and
67.0 Quartz material (FB-3 S(X), Denka Company)

For the manufacture of an inventive casting resin formulation, the organic formulation components are dissolved at room temperature and are homogenized with the magnetic stirrer. The filler material is then dispersed in for 15 minutes at 3500 revolutions per minute using a laboratory dissolver (e.g. Pendraulik LM 34). Degassing then takes place for 15 minutes at 0.2 mbar with stirring using a vane stirrer. The composition produced in this way can be stored at room temperature for at six months, and can be dosed using a pressure/time dispenser with or without pre-heating.

The inventive resins display the advantages of storability at room temperature, better underfill behavior and UV hardenability.

With the inventive compound, 20 µm gaps in a chip substrate can be filled in a few minutes at a high temperature (e.g., 60 to 90° C., preferably 75° C.); the hardening can thereby be initiated by UV radiation and/or thermally.

The hardening ensues after the UV initiation (1500 mJ; the sealing compound is then already hard and the component can be handled without difficulty) by means of thermal after hardening (e.g., 15 minutes at 150° C.). However, hardening can also take place exclusively thermally, i.e., without UV-initiated pre-hardening (e.g., 16 hours at 130°, or 6 hours at 140°, or 3 hours at 1500).

The inventive molding materials hardened in this way have characteristic values [expansion coefficients (25 ppm/

K), stress behavior in the bending beam test (122 rel. Units), temperature cycle strength (−40° C./125° C., 100 cycles)] that are comparable to those from the prior art.

With respect to absorption of humidity and E-corrosion behavior, the inventive molding compounds fulfil the requirements for chip covering compounds, with 0.3% (3 d 23° C., distilled water) and AN 1.2 (VDE 0303).

In the following, the invention is explained in more detail on the basis of a schematic Figure.

In the Figure, the substrate 1 is drawn in at the bottom with hatching, and above this the chip 2 is shown without hatching. The substrate 1 and chip 2 are connected with one another by means of several soldered contacts 3. The height of these soldered points, e.g., 20 μm, determines the height of the gap. When the sealing compound is dosed along the edge of the chip in front of the gap, the compound underflows the gap due to capillary action.

With the formulation indicated above in the example, a 20 μm gap can be underfilled with resin within 10 minutes at a substrate temperature of 75° C. For comparison, let it be noted that with the best commercially available sealing compounds, such as for example Hysol FP 4511, the 20 μm gap could be filled only to about 20% with partial filling material filtration under the conditions indicated above.

It is thus clear that the inventive casting resin formulation not only comprises essentially better storage life, but also shows better performance in use, such as e.g. gap filling behavior and processing temperature. In addition, it can thus be seen that the homogeneity of the inventive formulations is superior to that of the sealing compounds in the prior art.

The inventive resins show the advantages of storability at room temperature, better underfill behavior and UV hardenability. Storage stability thereby relates to a time of 6 months.

From the above description, it is apparent that the objects and advantages of the present invention have been achieved. While only certain embodiments have been set forth, alternative embodiments and various modifications will be apparent from the above description to those skilled in the art. These and other alternatives are considered equivalents and within the spirit and scope of the present invention.

What is claimed:

1. An electronic component comprising:
   a substrate layer,
   a chip disposed on top of a substrate, the chip being connected to the substrate by a plurality of soldered contacts disposed between an underside of the chip and a top surface of the substrate, the soldered contacts defining a gap between an underside of the chip and the top surface of the substrate, the gap accommodating a casting resin formulation comprising
   an epoxy resin;
   an isocyanurate siloxane
   a filler material having a grain size of less than 20 μm;
   a photo initiator; and
   a thermal initiator.

2. The electronic component of claim 1 wherein the epoxy resin is present in an amount ranging from about 15% to about 75% by weight,
   the siloxane is present in an amount ranging from about 0.2% to about 15% by weight,
   the filler material is present in an amount ranging from about 25% to about 85% by weight,
   the photo initiator is present in an amount ranging from about 0.01% to about 5% by weight, and
   the thermal initiator is present in an amount ranging from about 0.01% to about 5% by weight.

3. The electronic component of claim 1 wherein the epoxy resin is further characterized as being a cycloaliphatic epoxy resin.

4. The electronic component of claim 1 wherein the photo initiator is further characterized as being a triarylsulfonium salt.

5. The electronic component of claim 1 wherein the thermal initiator is further characterized as being a benzylthiolanium salt.

6. An electronic component comprising:
   a substrate layer,
   a chip disposed on top of a substrate, the chip being connected to the substrate by a plurality of soldered contacts disposed between an underside of the chip and a top surface of the substrate, the soldered contacts defining a gap between an underside of the chip and the top surface of the substrate, the gap accommodating a casting resin formulation comprising
   an epoxy resin;
   a siloxane;
   a filler material having a grain size of less than 20 μm and wherein the grains of the filler material have a spherical shape;
   a photo initiator; and
   a thermal initiator.

7. The electronic component of claim 6 wherein the siloxane is further characterized as being an isocyanurate siloxane.

* * * * *